(12) United States Patent
Omura et al.

(10) Patent No.: US 7,531,876 B2
(45) Date of Patent: May 12, 2009

(54) SEMICONDUCTOR DEVICE HAVING POWER SEMICONDUCTOR ELEMENTS

(75) Inventors: Ichiro Omura, Yokohama (JP); Kenji Takahashi, Tsukuba (JP); Chiaki Takubo, Tokyo (JP); Hideo Aoki, Yokohama (JP); Hideo Numata, Yokohama (JP); Mie Matsuo, Kamakura (JP); Hirokazu Ezawa, Tokyo (JP); Susumu Harada, Yokohama (JP); Hisashi Kaneko, Fujisawa (JP); Hiroshi Ikenoue, Hiratsuka (JP); Kenichi Matsushita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 11/230,624

(22) Filed: Sep. 21, 2005

(65) Prior Publication Data
US 2006/0071271 A1  Apr. 6, 2006

(30) Foreign Application Priority Data
Sep. 24, 2004 (JP) .......................... P2004-277960
Jul. 27, 2005 (JP) .......................... P2005-216894

(51) Int. Cl.
*H01L 23/62* (2006.01)
(52) U.S. Cl. .................. 257/343; 257/328; 257/335; 257/774; 257/E29.258; 257/E21.42
(58) Field of Classification Search ............... 257/342, 257/691, 711, E29.257, E29.258, 328, 329, 257/E21.418, E29.274, E27.022, E27.054, 257/E29.118, E29.198, 774, 327, 343, 408, 257/409, 335, E21.42
See application file for complete search history.

(56) References Cited

U.S. PATENT DOCUMENTS 5,426,072 A  *  6/1995  Finnila .................... 438/107

(Continued)

FOREIGN PATENT DOCUMENTS

JP          63-194367          8/1988

(Continued)

OTHER PUBLICATIONS

"Wafer Level Chip Size Packaging Technology for Power Devices Using Low Ohmic Through-Hole Vias," E. van Grunsven, D. Heyes M. de Samber, B. Schlatmann, K. vd Vlist, 14th European Microelectronics and Packaging Conference & Exhibition, Friedrichshafen, Germany, Jun. 23-25, 2003, p. 46-50.

(Continued)

*Primary Examiner*—Matthew Smith
*Assistant Examiner*—Julio J Maldonado
(74) *Attorney, Agent, or Firm*—Oblon, Spivak, McClelland, Maier & Neustadt, P.C.

(57) ABSTRACT

A semiconductor device which is compact and thin in size, low in resistance of a current path and parasitic inductance and excellent in reliability is provided. This semiconductor device comprises a semiconductor substrate, a first main electrode which is formed on a front surface of the semiconductor substrate, a second main electrode which is formed on a rear surface of the semiconductor substrate, and a conducting portion which is formed in a direction to pierce through the semiconductor substrate, wherein the second main electrode is extracted to the front surface of the semiconductor substrate via the conducting portion. And, the conducting portion is a through via which has a through hole formed through the semiconductor substrate in its thickness direction and a conductive portion which is formed in the through hole and connected to the second main electrode.

14 Claims, 10 Drawing Sheets

U.S. PATENT DOCUMENTS

| | | | |
|---|---|---|---|
| 5,753,529 A * | 5/1998 | Chang et al. | 438/118 |
| 5,767,578 A | 6/1998 | Chang et al. | |
| 6,114,768 A * | 9/2000 | Gaul et al. | 257/777 |
| 6,392,290 B1 * | 5/2002 | Kasem et al. | 257/678 |
| 6,420,755 B1 | 7/2002 | Bloos et al. | |
| 6,562,647 B2 | 5/2003 | Zandman et al. | |
| 6,767,820 B2 | 7/2004 | Standing et al. | |
| 6,784,537 B2 | 8/2004 | Moriguchi et al. | |
| 2007/0235774 A1 * | 10/2007 | Zandman et al. | 257/256 |

FOREIGN PATENT DOCUMENTS

| | | |
|---|---|---|
| JP | 1-185943 | 7/1989 |
| JP | 4-171765 | 6/1992 |
| JP | 7-326742 | 12/1995 |
| JP | 11-68092 | 3/1999 |
| JP | 2003-86737 | 3/2003 |
| JP | 2004-64063 | 2/2004 |

OTHER PUBLICATIONS

"Through Wafer Interconnection Technologies for Advanced Electronic Devices," Marc de Samber, Ton Nellissen and Eric van Grunsven, Phillips Centre for Industrial Technology, 2004 Electronics Packaging Technology Conference, p. 1-6.

* cited by examiner

SEMICONDUCTOR DEVICE HAVING POWER SEMICONDUCTOR ELEMENTS

CROSS-REFERENCE TO RELATED APPLICATION

This application is based upon and claims the benefit of priorities from the prior Japanese Patent Application No. 2004-277960 filed on Sep. 24, 2004 and from the prior Patent Application No. 2005-216894 filed on Jul. 27, 2005; the entire contents of which are incorporated herein by reference.

BACKGROUND

1. Field of the Invention

The present invention relates to a semiconductor device and a method of manufacturing it, and more specifically to a semiconductor device having so-called power semiconductor elements such as a power transistor, a rectifying element and the like and a method of manufacturing the semiconductor device.

2. Description of the Related Art

A surface mounted type semiconductor device can be mounted securely and easily on a mounting substrate (printed circuit board), on which a wiring pattern is formed, by a solder reflow method, a flow method or the like and has advantages that it is compact, light and excellent in reliability.

Figure 18:
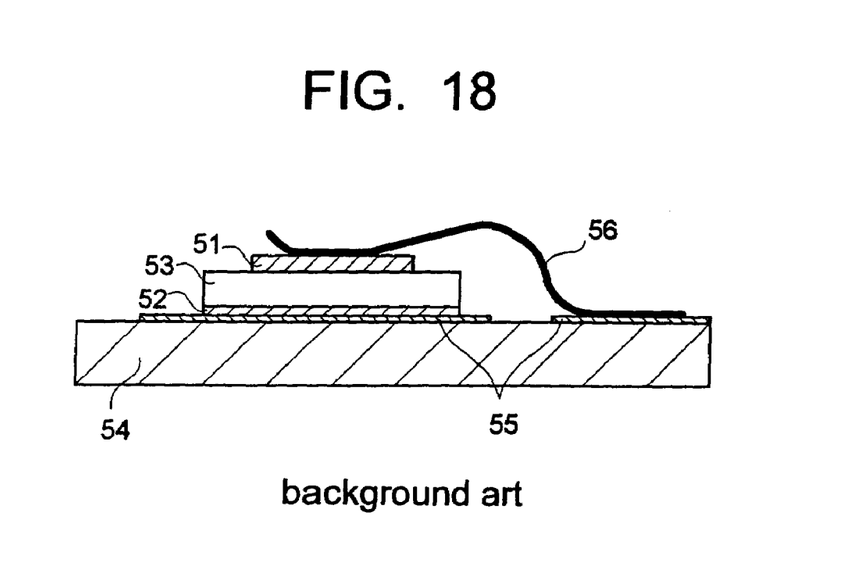
FIG. 18 is a sectional view showing an example of a structure of a conventional power semiconductor device.

Conventionally, a power semiconductor element such as a power transistor (for example, power MOSFET) has a so-called vertical structure in which two main electrodes, a source electrode 51 and a drain electrode 52, are disposed on both the surfaces of a semiconductor chip 53 as shown in FIG. 18. And, a semiconductor device on which the vertical type semiconductor element is mounted is configured that an electrode (e.g., the source electrode 51), which is not directly bonded to a wiring pattern 55 of a mounting substrate (printed circuit board) 54, is connected to a source side wiring pattern 55 via a bonding wire 56.

As a compact and thin semiconductor device excelling in heat dissipation, there is proposed a semiconductor device which is configured by disposing a metallic lead frame on a resin layer which is formed to cover a semiconductor chip, and exposing the end surface of an electrode terminal which is extracted from the semiconductor chip via the lead frame and the surface of the electrode of the semiconductor chip on the plane surface of the mounting surface (e.g., Japanese Patent Laid-Open Application No. 2003-086737).

In addition, there is proposed as a chip scale surface mounted device a semiconductor device having a structure that a metallic clip or cap of a copper alloy or the like is bonded instead of a bonding wire to a semiconductor chip by a conductive adhesive (e.g., U.S. Pat. No. 6,767,820).

But, the above semiconductor devices have a decrease in efficiency of the circuit because they have a high wire resistance or inductance. In addition, they have an increase in mounting area depending on the lead frame or cap. Therefore, sufficient miniaturization could not be achieved. And, the semiconductor device described in U.S. Pat. No. 6,767,820 had a disadvantage that its cost was high because the used material cost was high.

An object of the present invention is to provide a semiconductor device which is thin and compact in size, low in current path resistance and parasitic inductance and excellent in reliability; and a method of manufacturing such a highly reliable semiconductor device.

SUMMARY

According to a first aspect of the present invention, there is provided a semiconductor device, comprising a semiconductor substrate; a first main electrode formed on a front surface which is an element surface of the semiconductor substrate; a second main electrode formed on a rear surface of the semiconductor substrate; and a conducting portion formed in a direction to pierce through the semiconductor substrate, wherein the second main electrode is extracted to the front surface of the semiconductor substrate via the conducting portion.

According to a second aspect of the present invention, there is provided a semiconductor device, comprising a first-conduction type semiconductor substrate; a first layer having a first-conduction type which is formed on one surface of the first-conduction type semiconductor substrate; a second-conduction type layer which is formed in a prescribed region of the surface of the first layer having the first-conduction type; a first main electrode which is formed to be connected to the second-conduction type layer; a second main electrode which is formed on the other surface of the first-conduction type semiconductor substrate; a through hole which is formed to pierce through the first-conduction type semiconductor substrate and the first layer having the first-conduction type; a conductive portion which is formed within the through hole and connected to the second main electrode; and an electrode pad which is formed on the same surface side of the first-conduction type semiconductor substrate as the first main electrode and connected to the conductive portion.

According to a third aspect of the present invention, there is provided a method of manufacturing a semiconductor device, comprising forming a first main electrode on the element surface of a semiconductor substrate which has elements integrated and formed on its surface; forming a second main electrode on the rear surface of the semiconductor substrate; forming a through hole by irradiating a laser beam to the semiconductor substrate on which the second main electrode is formed; forming a conductive portion which is connected to the second main electrode within the through hole; and forming an electrode pad which is connected to the conductive portion on the same surface side of the first-conduction type semiconductor substrate as the first main electrode.

BRIEF DESCRIPTION OF THE DRAWINGS

The present invention will be described with reference to the drawings, which are provided for illustration only and do not limit the present invention in any respect.

DETAILED DESCRIPTION

A semiconductor device according to one aspect of the present invention is thin and compact in size and excellent in reliability and in the semiconductor device an electrode and a wiring pattern on a mounting substrate can be connected by a very short distance, enabling to reduce a resistance.

And, a distance between wiring patterns connecting two main electrodes on the mounting substrate can be decreased, so that parasitic inductance of a current path can be decreased substantially. In addition, mounting is easy and the cost is low.

A method of manufacturing a semiconductor device according to one aspect of the present invention can provide a semiconductor device which is thin, compact, small in current path resistance and parasitic inductance and excellent in reliability.

Hereinafter, modes of conducting the present invention will be explained with reference to the drawings. Embodiments of the present invention are described with reference to the drawings, which are provided for illustration only, and the present invention is not limited to the drawings.

Figure 1:
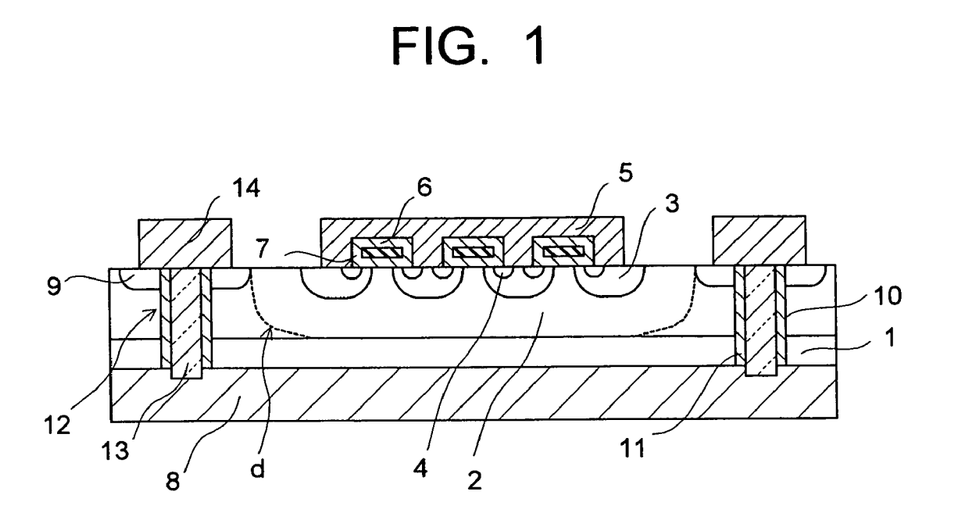
FIG. 1 is a sectional view showing a structure of a planar type MOSFET according to a first embodiment of the present invention.

FIG. 1 is a sectional view schematically showing a structure of a planar type MOSFET which is a semiconductor device according to a first embodiment of the present invention.

In the drawing, reference numeral 1 denotes an N type silicon substrate (N+substrate) which is a first-conduction type semiconductor substrate, and an N drift layer 2 is formed on one side of the N+substrate 1. A P type layer 3 which is a second-conduction type layer is formed in a prescribed region of the surface of the N drift layer 2. And, an N source layer 4 is formed in a prescribed region of the surface of the P type layer 3.

A source electrode 5 which is a first main-electrode is formed so as to come into contact with the P type layer 3 and the N source layer 4. A gate electrode 6 which is a control electrode is formed on the surface of the N source layer 4, the surface of the P type layer 3 and the surface of the N drift layer 2. The gate electrode 6 is disposed to oppose the N source layer 4, the P type layer 3 and the N drift layer 2 with an insulating film (gate oxide film) 7 interposed therebetween.

And, a drain electrode 8 which is a second main electrode is formed on the other side (the opposite side of the N drift layer 2, which is also called as the rear surface hereinafter) of the N+substrate 1. The drain electrode 8 has desirably a thickness of 5 μm or more and more preferably 20 to 30 μm. The drain electrode 8 can be determined to have a thickness of 5 μm or more so as to decrease a resistance value of the current path ranging from an N+layer to be described later to a conductive portion through the drain electrode 8. In addition, when the drain electrode 8 is determined to have a thickness of 20 to 30 μm, there is an advantage that the drain electrode 8 can be a laser stopper layer to form a through hole by laser irradiation.

In addition, an N+layer 9 is formed on the surface of the N drift layer 2. The N+layer 9 is formed in a prescribed region such that it is not in contact with the P type layer 3.

A through hole 10 is formed through the N+substrate 1 and the N drift layer 2 in the region where the N+layer 9 is formed. And, a conductive portion 11 is formed within the through hole 10 by plating a conductor metal, or the like. The conductive portion 11 is connected to the drain electrode 8 to form a through via 12 which brings the front and rear surfaces of the silicon substrate into conduction. The through via 12 indicates a through hole conducting portion which includes the through hole 10 and the conductive portion 11 formed within the through hole 10.

The through hole 10 can be formed by laser irradiation. The laser can be, for example, a YAG laser having a wavelength of 355 nm but is not limited to it. The through hole 10 desirably has a diameter of 10 to 50 μm and more preferably 20 to 30 μm. When the through hole 10 is determined to have a diameter of 10 μm or more, the electric resistance of the through via 12 can be decreased to realize a lower resistance value than when connected by a bonding wire or the like. If the through hole 10 has an excessively large diameter, it is not desirable because the silicon substrate is easily cracked.

The conductive portion 11 of the through via 12 may have a cylindrical shape to fill the interior of the through hole 10 but more desirably have a tubular shape to coat the inside wall surface. It is preferable that the conductive portion 11 has a thickness of about 5 μm to decrease a resistance. When the conductive portion 11 has a tubular shape, increase of a resistance by a skin effect of electric current is prevented. There are provided effects that a conductive material for forming the conductive portion 11 can be decreased, and the time required for plating can be decreased. An insulating material 13 such as insulating resin can also be charged on the conductive portion 11.

Figure 2:
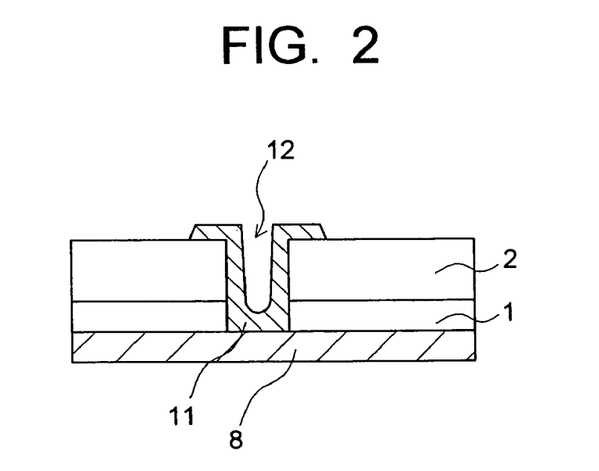
FIG. 2 is a sectional view showing another example of the through via of the semiconductor device shown in FIG. 1.

The conductive portion 11 is not required to have a perfect tubular shape but may have a U-shaped cross section with the conductive layer formed at the bottom of the through hole 10 as shown in FIG. 2. In addition, a structure having the conductive portion 11 directly contacted to the side wall of the through hole 10 is manufactured easily at a low cost, but another structure that an insulating layer is formed on the inside wall of the through hole 10 to electrically insulate the semiconductor portion from the conductive portion 11 in the through hole 10 can also be provided depending on usage. By configuring in this way, a leakage of electric current does not occur, and it is not necessary to dispose the N+layer as described in a second embodiment later.

A drain pad 14 which is a connecting electrode pad is formed in the through via 12 on the same side of the source electrode 5. The conductive portion 11 of the through via 12 is in contact with the drain pad 14, and the drain pad 14 and the drain electrode 8 are connected via the through via 12. To obtain a sufficient pad area, the drain pad 14 can be extended onto the source electrode 5. In other words, the drain pad 14 may be disposed to overlap the source electrode 5 with the insulating layer between them. The overlap region can have a size of 100 μm or more when the through via 12 is formed in the peripheral portion of the semiconductor chip, and only one side of the through-hole is used to overlap. Thus, the drain pad 14 is disposed to overlap, so that a connection area to a mounting substrate and a bump electrode described later can be increased, and a connection resistance can be decreased.

The through via 12 which electrically conducts the drain pad 14 and the drain electrode 8 is not necessarily formed in the region of the N+layer 9 but may be formed in a region where at least a part of the N+layer 9 is interposed between the P type layer 3 and the through via 12. In other words, the N+layer 9 serves as a stopper to suppress extending of a depletion layer from the P type layer 3. Therefore, when the N+layer 9 is disposed between the P type layer 3 and the through via 12, an end (d) of the depletion layer does not reach the side wall surface of the through hole 10.

The through hole 10 formed by the laser irradiation has defects in the silicon crystal of its side wall surface. Accordingly, when the depletion layer reaches the side wall surface of the through hole 10, the P type layer 3 becomes conductive to the conductive portion 11 within the through hole 10, and small current leaks and flows in off state. But, the provision of the N+layer 9 between the through via 12 and the P type layer 3 can prevent the depletion layer from extending and reaching the side wall surface of the through hole 10. Current leakage can be prevented from taking place and a malfunction and unnecessary heat can be prevented from occurring.

The semiconductor device of the first embodiment can be manufactured according to the following procedure.

Figure 3A:
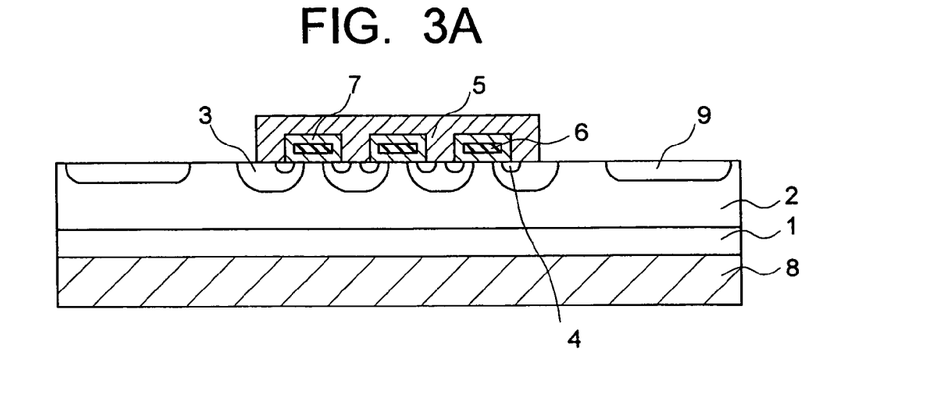
FIG. 3A, FIG. 3B and FIG. 3C are sectional views illustrating a method of manufacturing the semiconductor device of the first embodiment.

First, the N drift layer 2 is formed on one side of the N+substrate 1 by an epitaxial growth as shown in FIG. 3A. The P type layer 3 and the N source layer 4 are sequentially formed on a prescribed region of the surface of the N drift layer 2. And, the N+layer 9 is formed on a prescribed region of the surface of the N drift layer 2 so as not to come into contact with the P type layer 3.

Then, the gate electrode 6 having the insulating film (gate oxide film) 7 is formed on the N source layer 4, the P type layer 3 and the N drift layer 2. The source electrode 5 is formed to come into contact with the P type layer 3 and the N source layer 4. In addition, the drain electrode 8 is formed on the rear surface of the N+substrate 1.

Figure 3B:
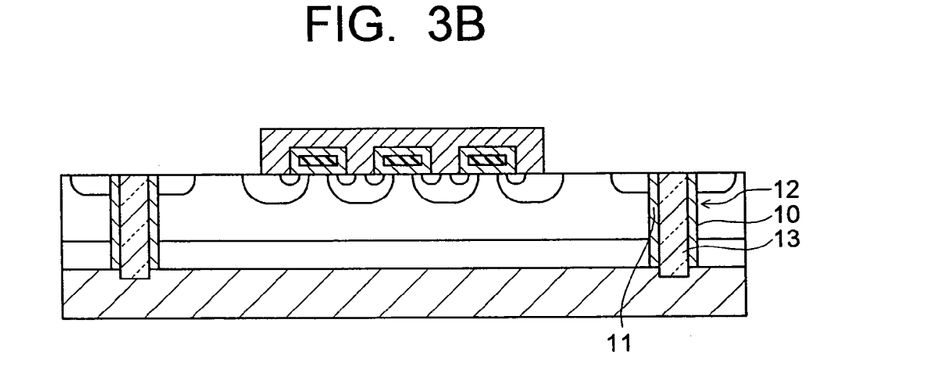

Next, the through hole 10 which pierces through the N+substrate 1 and the N drift layer 2 is formed by irradiating a laser, for example, a YAG laser (a wavelength of 355 nm), to a prescribed region such as a region of forming the N+layer 9 as shown in FIG. 3B. Then, the conductive portion 11 is formed within the through hole 10 by a method of electroless plating of conductive metal and then electroplating or the like. If necessary, the insulating material 13 can be charged onto the conductive portion 11 within the through hole 10 by a method of printing an insulating resin paste. The insulating material 13 can also be charged into the through hole 10 by roll coating the insulating resin paste.

Figure 3C:
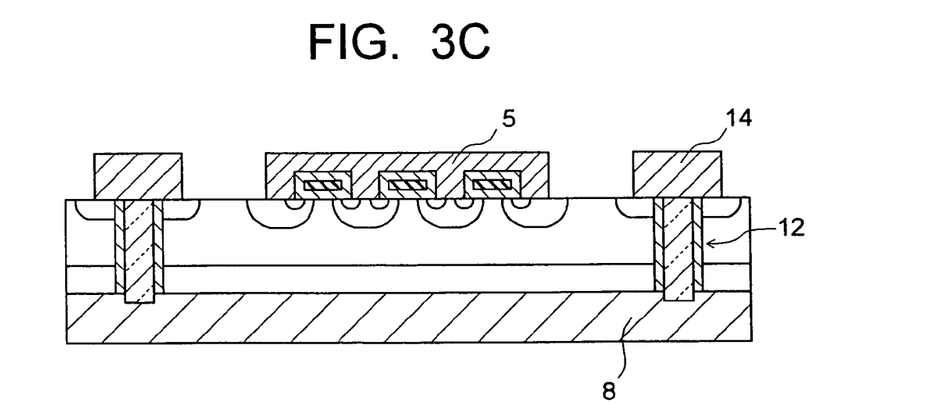

Then, the drain pad 14 is formed on the formed through via 12 as shown in FIG. 3C.

According to the above manufacturing method, the through hole 10 is formed by the laser irradiation, so that the semiconductor device can be manufactured at a low cost because mask exposure and developing steps are few. And, the drain electrode 8 can be used as a laser irradiation stopper layer.

Figure 4:
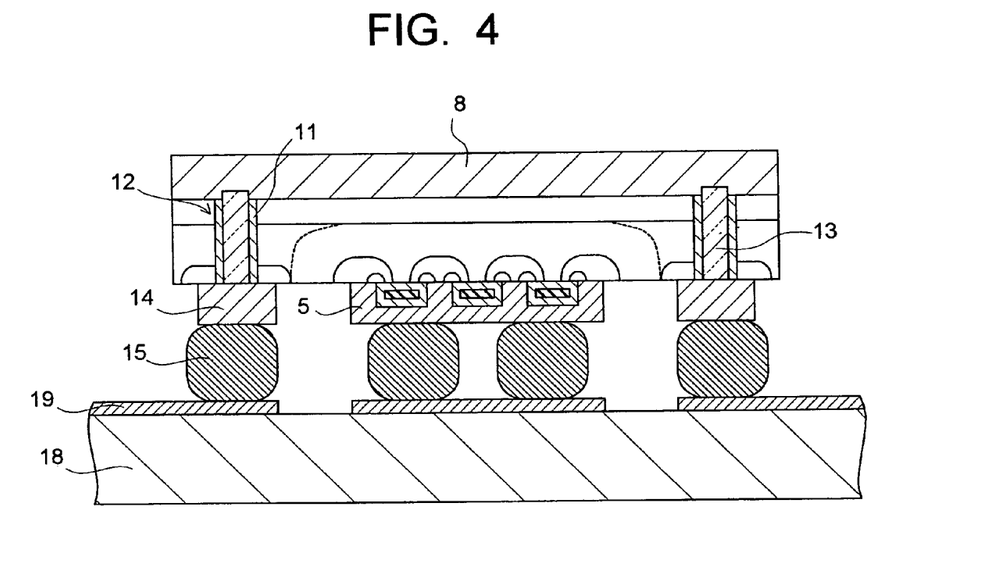
FIG. 4 is a sectional view showing an example of a mode of mounting the semiconductor device of the first embodiment.

The semiconductor device of the first embodiment manufactured as described above can have individual connecting bump electrodes 15 disposed on the drain pad 14 and the source electrodes 5 as shown in FIG. 4 and the bump electrodes 15 can be connected to a wiring pattern 19 on a mounting substrate 18 such as a printed-circuit board. In FIG. 4, a gate electrode pad is omitted but preferably disposed on the same side as the source electrode 5.

Figure 5:
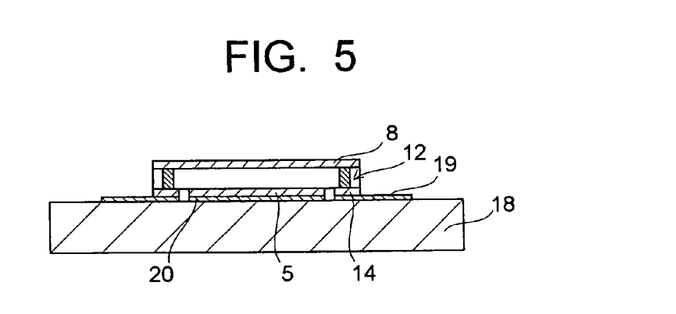
FIG. 5 is a sectional view showing another mode of mounting the semiconductor device of the first embodiment.

The semiconductor device of the first embodiment can also adopt another mounting mode. Specifically, a solder-plated layer (not shown) is formed on the drain pad 14 and the source electrode 5 and these solder-plated layers can be soldered in contact with corresponding wiring patterns 19, 20 of the mounting substrate 18, as shown in FIG. 5.

Figure 6:
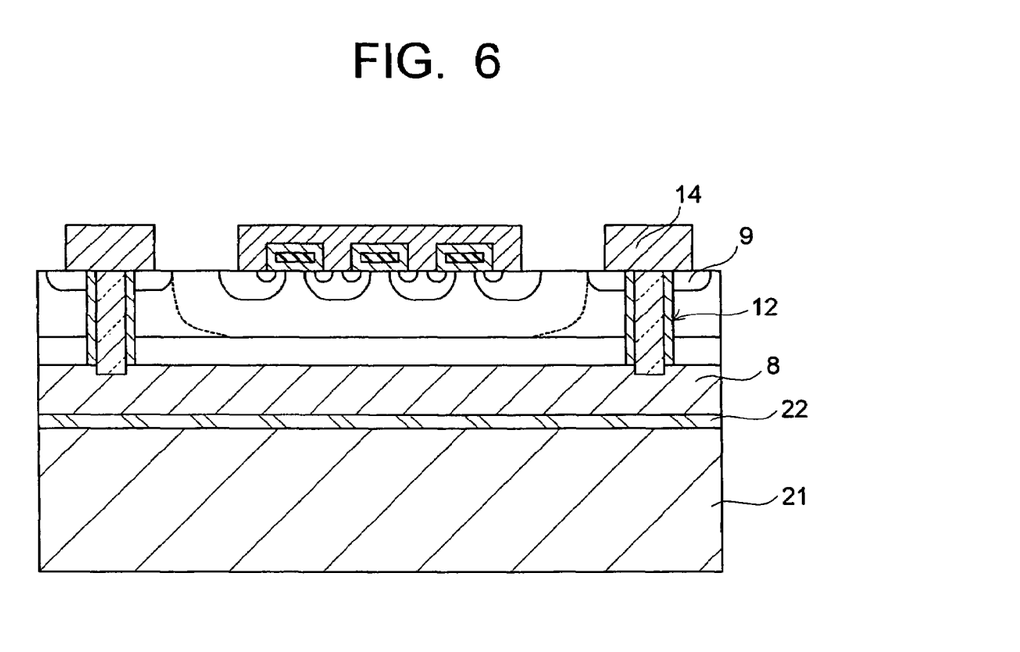
FIG. 6 is a sectional view showing another structure of the semiconductor device of the first embodiment.

In addition, according to this mounting mode, a metal plate 21 of copper or the like can be bonded to an exposed surface (bottom surface) of the drain electrode 8 with solder 22 as shown in FIG. 6. By configuring in this way, thermal resistance and transient thermal resistance are improved by the heat radiating effect of the metal plate 21.

In the semiconductor device of the first embodiment mounted as described above, the electric resistance is small because the drain electrode 8 and the wiring pattern 19 on the mounting substrate 18 are connected within very short length. Length between the wire 20 which is connected to the source electrode 5 and the wire 19 which is connected to the drain electrode 8, on the mounting substrate 18, is short. Therefore, the parasitic inductance of the current path is very small. And, this semiconductor device can be made compact and thin since it is made small in terms of, for example, an area ratio by 30 to 40% in comparison with a conventional semiconductor device having a clip or cap of a copper alloy and its total thickness can be made thinner by about 0.3 mm.

Next, the position of the through via 12 of the semiconductor device of the first embodiment will be described. The through via 12 is normally formed in plural for a single semiconductor chip and disposed in a peripheral region of the chip. Examples indicating the located positions of the through via 12 are shown in FIG. 7 to FIG. 9.

As shown in the drawings, the through via 12 is formed at all or part of four corners or sides of the semiconductor chip 16 and outside of an element-forming termination region (E). Here, the element-forming termination region (E) indicates a region ranging from an outside boundary line (p) of the P type layer continuously expanded from the active area of the element MOSFET to the inside boundary line (n) of the N+layer which is positioned its outside. In FIG. 7 to FIG. 9, the located positions of the connecting bump electrode are indicated by alternate long and short dash lines.

Figure 7:
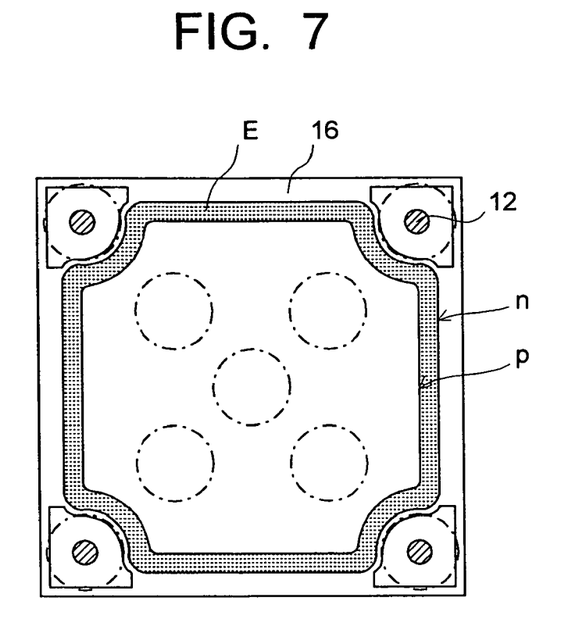
FIG. 7 is a plan view showing an example of arrangement of through via of the semiconductor device shown in FIG. 1.
Figure 8:
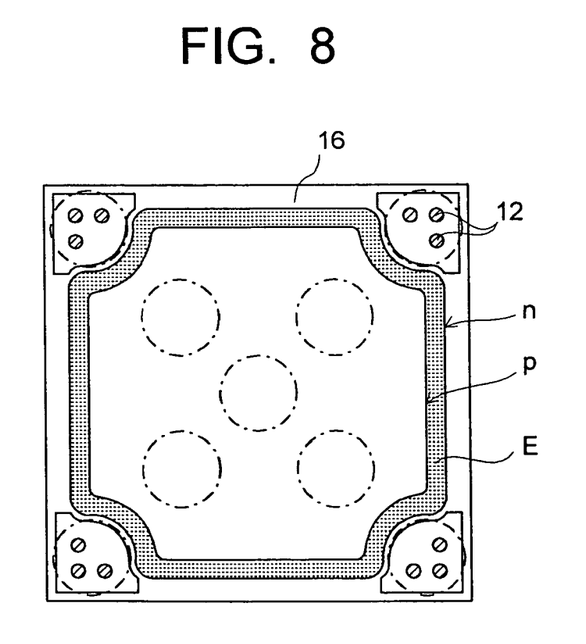
FIG. 8 is a plan view showing another example of arrangement of through via of the semiconductor device shown in FIG. 1.
Figure 9:
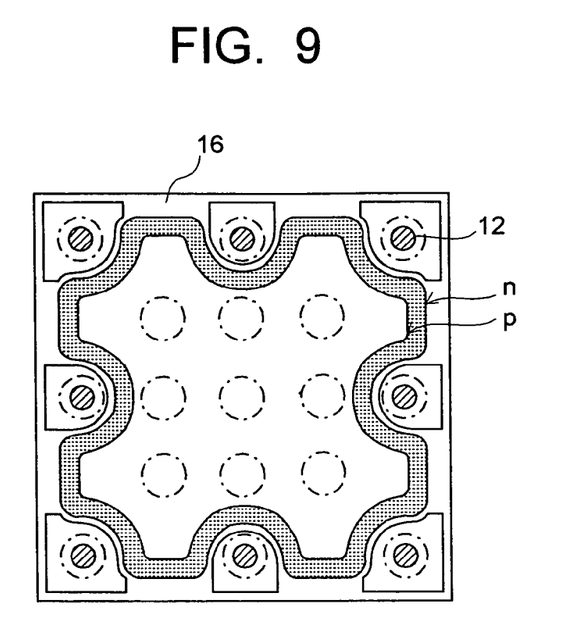
FIG. 9 is a plan view showing a third example of arrangement of through via of the semiconductor device shown in FIG. 1.

As shown in FIG. 7 to FIG. 9, the semiconductor device having the through via 12 arranged has the element-forming termination region (E) formed to surround a part of the periphery of the through via 12 and has an S-shaped planar shape having a curbed point near the through via 12 or a curved planar shape having a partial recess. By configuring in this manner, a dead space of the semiconductor chip 16 can be decreased to maximize the active area of the element and to lower the resistance of the element. In the semiconductor device having the through via 12 as described above, it is not necessary to form an insulating layer between the through hole and its inside conductive portion. Therefore, the manufacturing cost and man hours can be reduced.

FIG. 8 indicates the arrangement of the through via 12 in a semiconductor device having a large chip size, where plural through vias 12 are disposed in correspondence with a singe bump electrode. To prevent electric current from locally concentrating by providing the effects uniformly, it is desirable to make the individual through via 12 have the same size (a through hole diameter and conductive portion thickness).

Figure 10:
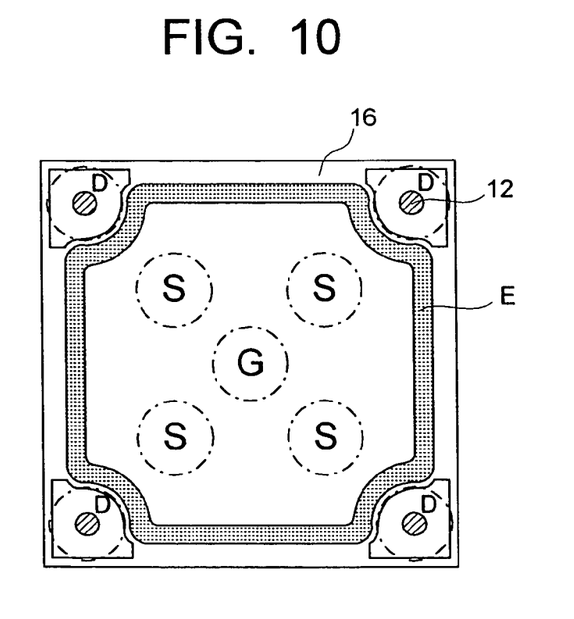
FIG. 10 is a plan view showing arrangement of connecting bump electrodes of the semiconductor device of the first embodiment.

A semiconductor device having a center gate structure that the gate electrode is at the center of a semiconductor chip has the individual bump electrodes disposed as shown in FIG. 10. In the drawing, G denotes the position of a gate connecting bump electrode, D denotes the positions of drain connecting bump electrodes, and S denotes the positions of source connecting bump electrodes. The semiconductor device configured as described above can produce effects of reducing inductance and in-plane equalizing of gate signals.

In addition, the semiconductor devices having the through vias 12 which are disposed as shown in FIG. 7 to FIG. 10 are desired to have a distance of 30 μm or more between the through hole and the inside boundary line (n) of the N+layer so that the end portion of the depletion layer does not reach the through via 12. Especially, the distance from the through hole to the inside boundary line (n) of the N+layer is determined to be equal to the thickness of the drift layer 2 or longer than it, so that an influence resulting from a defect in the silicon layer caused at the time of forming the through hole can be eliminated completely.

Other embodiments of the present invention will be described.

Figure 11:
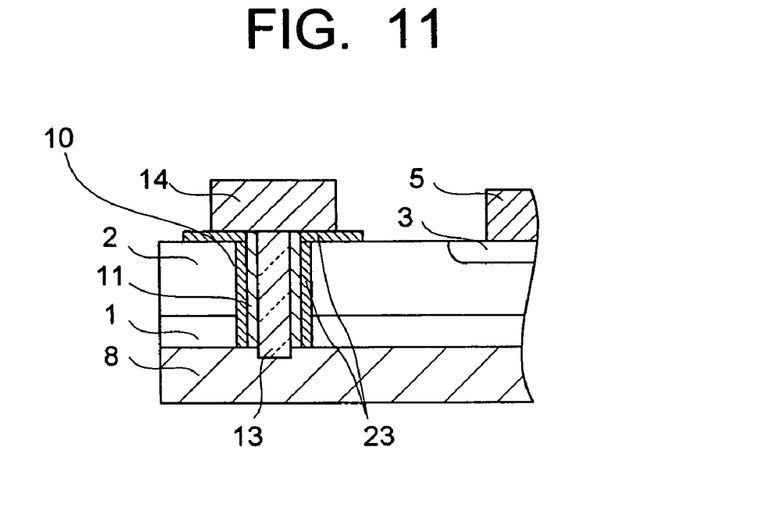
FIG. 11 is a sectional view showing a structure of the semiconductor device according to a second embodiment of the present invention.

FIG. 11 is a sectional view schematically showing a part of the structure of the semiconductor device according to a second embodiment of the present invention. In this embodiment, the N+layer is not formed, but the through hole 10 is formed in a prescribed region which is not in contact with the P type layer 3. And, an insulating resin layer 23 of polyimide or the like is formed on the side wall surface of the through hole 10 and the N drift layer 2 around the opening of the through hole 10.

The insulating resin layer 23 can be formed by printing an insulating resin paste or the like on the element surface side or applying the insulating resin by a roll coating method to charge the insulating resin into the through hole 10, and irradiating a laser beam to the insulating resin-charged portion to form a small-diameter through hole concentrically.

The conductive portion 11 is formed on the insulating resin layer 23 within the through hole 10 by a method of plating or the like. The conductive portion 11 is connected to the drain electrode 8, and the through via 12 is formed. In addition, the insulating material 13 such as an insulating resin is charged on the conductive portion 11. Since the other portions of the second embodiment are configured in the same manner as in the first embodiment, their graphic representation and explanation are omitted.

In the second embodiment, the N+layer which is formed in the first embodiment is not disposed, but the insulating resin layer 23 is formed on the side wall surface of the through hole 10. Therefore, even if an end portion (d) of the depletion layer extended from the P type layer 3 reaches the side wall surface of the through hole 10, the P type layer 3 is not connected to the conductive portion 11 within the through hole 10. A highly reliable semiconductor device can be obtained without involving the generation of leakage current.

Figure 12:
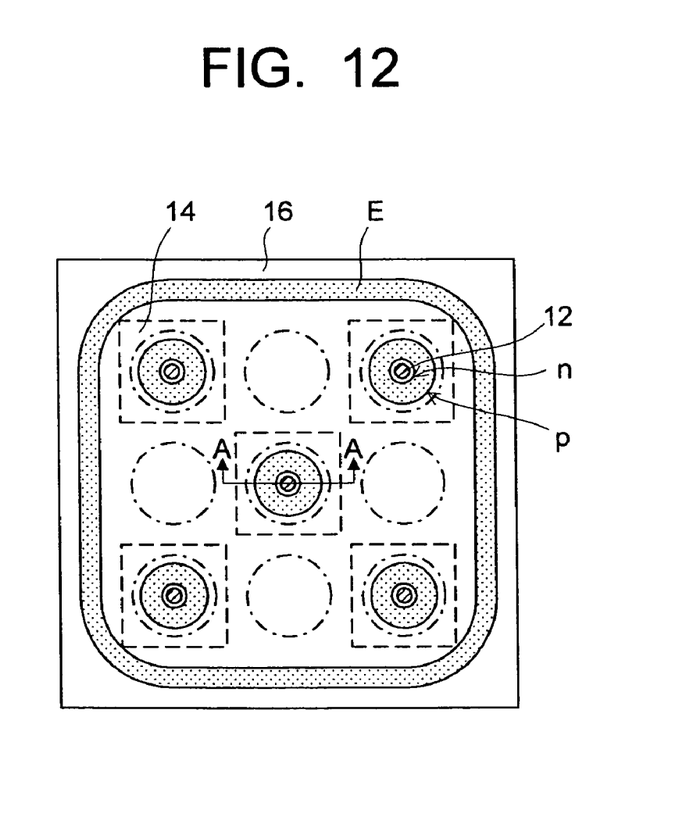
FIG. 12 is a top view showing a MOSFET according to a third embodiment of the present invention.
Figure 13:
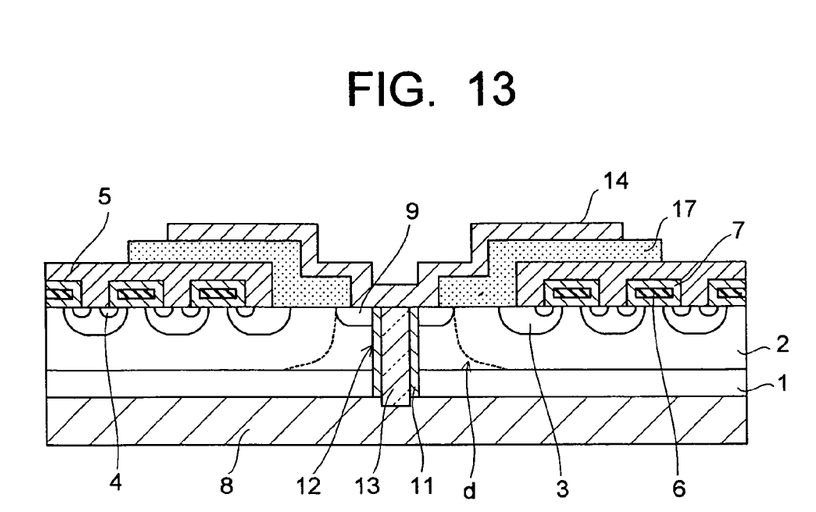
FIG. 13 is a sectional view taken along line A-A of FIG. 12.

FIG. 12 is a top view showing a MOSFET according to a third embodiment of the present invention. FIG. 13 is a sectional view taken along line A-A of FIG. 12. In these drawings, like parts as those of FIG. 1 and FIG. 7 to FIG. 9 are denoted by like reference numerals, and descriptions thereof will be omitted.

In the third embodiment, the P type layer 3 has a planar shape with plural holes, in which the N+layer 9 is formed not to come into contact with the P type layer 3. And, the through via 12 is formed at the center of the individual N+layers 9, and the drain pad 14 is formed above the through via 12. To obtain a sufficient pad area, the drain pad 14 is disposed to overlap the source electrode 5 with the insulating layer 17 of $SiO_2$ or the like interposed between them. The overlapped region may have a size of about 50 μm on one side and 100 μm or more as a whole. By determining the size of the overlapped region to the above-described range, the contact area when connected to the mounting substrate and the bump electrode can be increased and a connection resistance can be decreased.

Being compared with the first embodiment, the wiring inductance of the semiconductor device configured as described above can be reduced furthermore because the drain wiring and the source wiring on the mounting substrate can be disposed closer to each other. And, the current path from the drain pad 14, which is conductive to the drain electrode 8, to the source electrode 5 becomes shorter, so that a voltage drop due to the wiring resistance on the semiconductor chip 16 can be decreased. In addition-, there is an advantage that alignment at the time of mounting on the mounting substrate can be facilitated.

Figure 14:
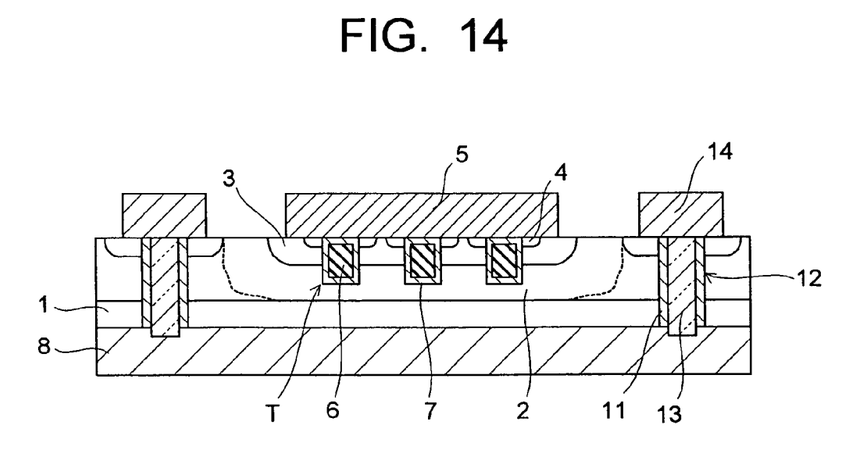
FIG. 14 is a sectional view showing a structure of a trench gate type MOSFET according to a fourth embodiment of the present invention.

FIG. 14 is a sectional view showing a structure of a trench gate type MOSFET which is the semiconductor device according to a fourth embodiment of the present invention.

The semiconductor device of the fourth embodiment is different from the planar type MOSFET of the first embodiment on the point that the gate electrode 6 is not disposed on the surface of the silicon substrate but disposed within trenches T formed from the surface into the inside of the silicon substrate. The other portions are configured in the same manner as in the first embodiment. In other words, the trenches T are formed from the surface side of the laminated structure of the P type layer 3 and the N source layer 4, the gate oxide film 7 is formed to cover the inside wall surfaces of the trenches T, and the gate electrode 6 is buried into the trenches T.

The semiconductor device of the fourth embodiment configured as described above provides a higher effect due to the reduction of the wiring resistance because the resistance of the element itself is small.

The MOSFET was described in the above embodiment, but the structure of the present invention can also be applied to another vertical switching element such as an IGBT (Insulated Gate Bipolar Transistor) and a vertical diode such as a PiN-diode, a Schottky barrier diode (SBD) or the like.

Figure 15:
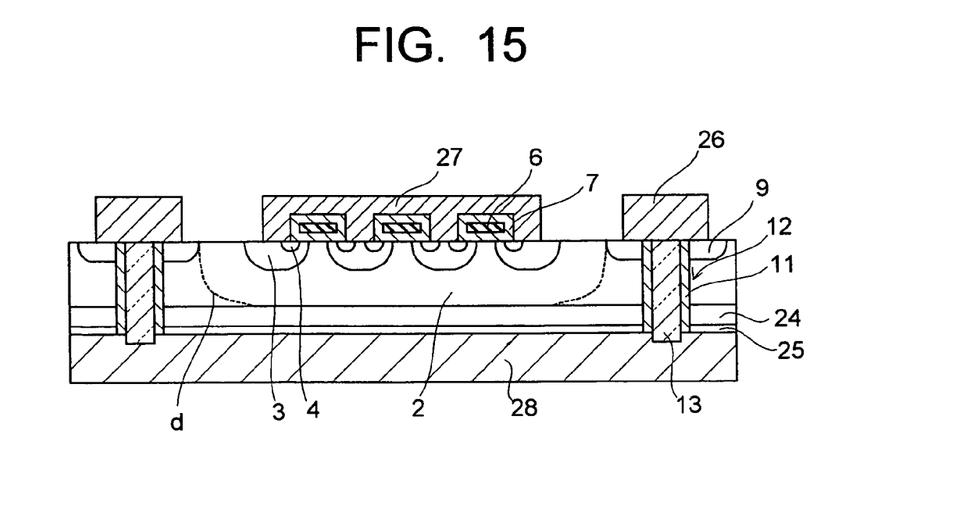
FIG. 15 is a sectional view showing a structure of an IGBT according to a fifth embodiment of the present invention.

FIG. 15 is a sectional view showing a structure of the IGBT according to a fifth embodiment of the present invention. In this drawing, reference numeral 24 denotes an N buffer layer and 25 denotes a P emitter layer. Reference numeral 26 denotes a collector pad corresponding to the drain pad of the first embodiment, 27 denotes an emitter electrode corresponding to the source electrode, and 28 denotes a collector electrode corresponding to the drain electrode. In FIG. 15, like parts as those of FIG. 1 are denoted by like reference numerals, and detailed descriptions thereof will be omitted.

Figure 16:
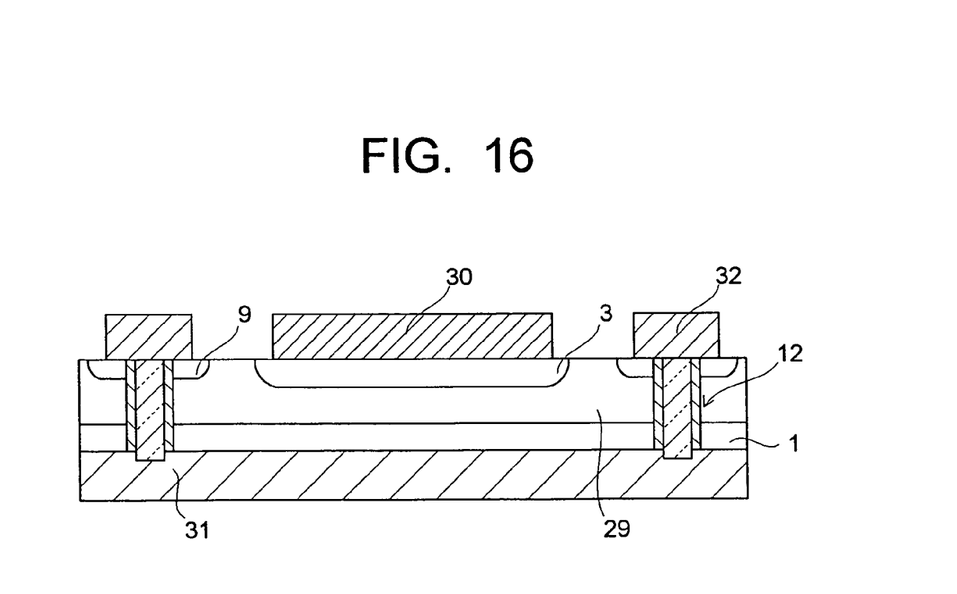
FIG. 16 is a sectional view showing a structure of a PiN-diode according to a sixth embodiment of the present invention.
Figure 17:
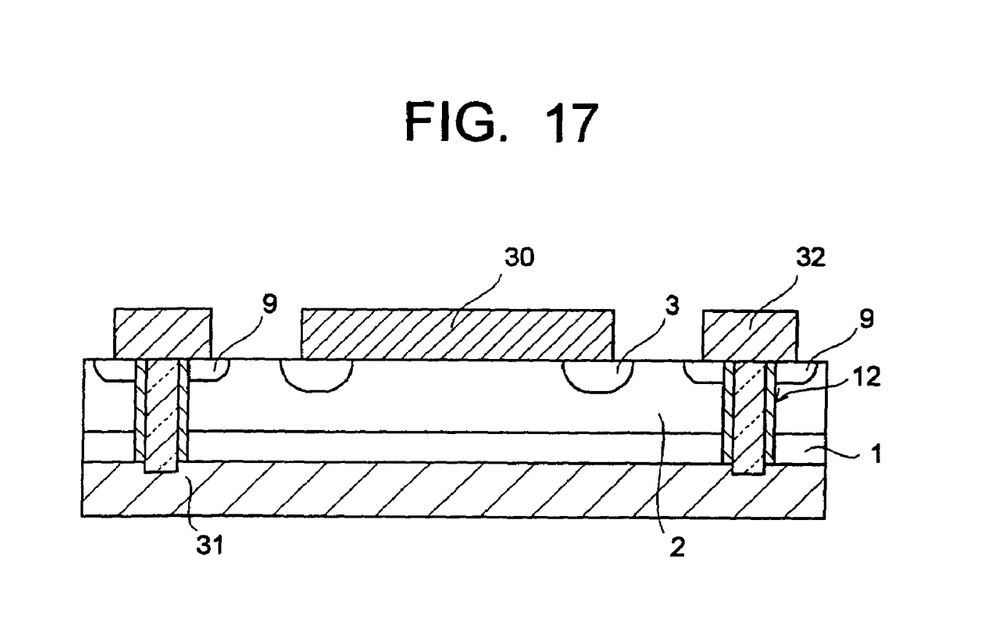
FIG. 17 is a sectional view showing a structure of an SBD according to a seventh embodiment of the present invention.

FIG. 16 is a sectional view showing a structure of a PiN-diode according to a sixth embodiment of the present invention, and FIG. 17 is a sectional view showing a structure of an SBD according to a seventh embodiment of the present invention. In FIG. 16, reference numeral 29 denotes a high resistance layer. In FIG. 16 and FIG. 17, reference numeral 30 denotes an anode electrode, 31 denotes a cathode electrode and 32 denotes a cathode pad. In these drawings, like parts as those of FIG. 1 are denoted by like reference numerals, and detailed descriptions thereof will be omitted.

The semiconductor devices shown in FIG. 15 through FIG. 17 can also provide the same effects as those provided by the MOSFETs of the first through fourth embodiments.

It is to be understood that the present invention is not limited to the specific embodiments thereof illustrated herein, and various modifications may be made without deviating from the spirit and scope of the invention as defined by the appended claims.

What is claimed is:

1. A semiconductor device, comprising:
    a first-conduction type semiconductor substrate;
    a first layer having the first-conduction type which is formed on one surface of the first-conduction type semiconductor substrate;
    a second-conduction type layer which is formed in a prescribed region of the surface of the first layer having the first-conduction type;
    a first main electrode which is formed to be electrically connected to the second-conduction type layer;
    a second main electrode which is formed on the other surface of the first-conduction type semiconductor substrate;
    a through hole which is formed to pierce through the first-conduction type semiconductor substrate and the first layer having the first-conduction type;
    a conductive portion which is formed within the through hole and connected to the second main electrode;
    an electrode pad which is formed on the same surface side of the first-conduction type semiconductor substrate as the first main electrode and connected to the conductive portion; and
    a second layer having the first-conduction type which is formed in a prescribed region of the surface of the first layer having the first-conduction type not to come into contact with the second-conduction type layer,
    wherein the through hole is formed in a region where the second layer having the first-conduction type is interposed between the through hole and the second-conduction type layer.

2. The semiconductor device as set forth in claim 1, further comprising an insulating layer formed on the side wall surface of the through hole, wherein the conductive portion connected to the second main electrode is formed on the insulating layer within the through hole.

3. The semiconductor device as set forth in claim 1, wherein the conductive portion formed within the through hole has a tubular conductive portion.

4. The semiconductor device as set forth in claim 1, further comprising:
    a third layer having the first-conduction type which is formed in a prescribed region of the surface of the second-conduction type layer; and
    a control electrode which is formed on the third layer having the first-conduction type, the second-conduction type layer and the first layer having the first-conduction type with an insulating film therebetween,
    wherein the first main electrode is formed to be connected to the second-conduction type layer and the third layer having the first-conduction type.

5. The semiconductor device as set forth in claim 4, further comprising
    an insulating layer formed on the side wall surface of the through hole, wherein the conductive portion connected to the second main electrode is formed on the insulating layer within the through hole.

6. The semiconductor device as set forth in claim 4, wherein the conductive portion formed within the through hole has a tubular conductive portion.

7. The semiconductor device as set forth in claim 4, wherein a part of the electrode pad is formed so as to laminate on the first main electrode with an insulating film between them.

8. The semiconductor device as set forth in claim 4, wherein the third layer having the first-conduction type is formed in a planar shape surrounded by the second-conduction type layer.

9. The semiconductor device as set forth in claim 4, wherein a plane curve of a boundary section near the third layer having the first-conduction type of the second-conduction type layer is formed to have an inflection point.

10. The semiconductor device asset forth in claim 4, wherein the second-conduction type layer has a planar shape with plural hales, in which second layer having the first-conduction type is formed not to come into contact with the second-conduction type layer, and the through hole is formed at the center of the second layer having the first conduction type.

11. The semiconductor device asset forth in claim 10, wherein the electrode pad, which is connected to the second main electrode via the conductive portion within the through hole, and the first main electrode are alternatively arranged so as to adjacent in a plane shape.

12. The semiconductor device as set forth in claim 1, wherein the first main electrode is formed to be directly connected to the second-conduction type layer.

13. The semiconductor device as set forth in claim 1, wherein the second-conduction type layer has a planar shape with plural holes, in which the second layer having the first-conduction type is formed not to come into contact with the second-conduction type layer, and the through hole is formed at the center of the second layer having the first conduction type.

14. The semiconductor device as set forth in claim 13, wherein the electrode pad, which is connected to the second main electrode via the conductive portion within the through hole, and the first main electrode are alternatively arranged so as to be adjacent in a plane shape.

* * * * *